United States Patent [19]

Matsuda et al.

[11] 4,384,248
[45] May 17, 1983

[54] METHOD AND APPARATUS FOR DETECTING SHORTCIRCUIT IN ARM OF GTO INVERTER

[75] Inventors: Yasuo Matsuda; Kazuo Honda; Takeo Maeda, all of Hitachi, Japan

[73] Assignee: Hitachi, Ltd., Tokyo, Japan

[21] Appl. No.: 160,174

[22] Filed: Jun. 17, 1980

[30] Foreign Application Priority Data

Jun. 22, 1979 [JP] Japan .................................. 54-78154
Dec. 17, 1979 [JP] Japan ................................ 54-162771

[51] Int. Cl.³ ...................... G01R 31/02; H02H 7/122; H02H 3/28
[52] U.S. Cl. ...................................... 324/51; 340/650; 361/86; 363/58
[58] Field of Search ................... 324/51, 133, 158 SC; 340/644, 645, 650, 651, 653, 661; 363/57, 58, 137; 361/85–88, 76, 78; 307/234, 510

[56] References Cited

U.S. PATENT DOCUMENTS

| | | | |
|---|---|---|---|
| 3,343,038 | 9/1967 | Johnson | 361/85 X |
| 3,524,200 | 8/1970 | Humpage et al. | 361/85 X |
| 3,916,287 | 10/1975 | Brenneisen et al. | 363/57 |
| 4,133,018 | 1/1979 | Terunuma et al. | 361/85 |
| 4,228,477 | 10/1980 | Claus et al. | 361/87 |
| 4,231,083 | 10/1980 | Matsuda et al. | 363/57 |

Primary Examiner—Gerard R. Strecker
Attorney, Agent, or Firm—Antonelli, Terry & Wands

[57] ABSTRACT

Shortcircuit in an arm including a series connection of GTO's and reactors of an inverter is detected by sensing a voltage across the reactor. In one method, the shortcircuit in the arm is detected when voltages are coincidently applied to a P-line arm reactor and an N-line arm reactor for a predetermined time period. In another method, it is detected when an integrated value of a voltage across at least one of the reactors exceeds a predetermined level.

6 Claims, 8 Drawing Figures

METHOD AND APPARATUS FOR DETECTING SHORTCIRCUIT IN ARM OF GTO INVERTER

BACKGROUND OF THE INVENTION

The present invention relates to method and apparatus for detecting a shortcircuit in an arm of an inverter, and more particularly to a method and apparatus for detecting a shortcircuit in an arm of an inverter formed by gate turn-off thyristors (GTO).

When a shortcircuit occurs in an arm of the inverter such that a P-line GTO and an N-line GTO turn on simultaneously, the current gradually increases because the GTO's are not able to function to suppress the current, resulting in breakdown of the GTO's. In the past, methods have been proposed to detect the shortcircuit in the arm of the inverter to stop the operation of the inverter device before the GTO's are broken down. In one method, a D.C. current which is a direct amount to be sensed is detected and in another method a voltage drop which is an indirect amount to be sensed is detected to sense the occurrence of the shortcircuit. Those methods, however, have the following disadvantages.

In the D.C. current detection method, when an output voltage is attenuated to zero in the GTO inverter of PWM (pulse width modulation) control type, three phases are operated in phase. Accordingly, three-phase charging currents for snubber capacitor flow coincidently in the D.C. portion of the inverter for each switching. Since these charging currents reach a large magnitude which is considerably higher than the controllable current of the GTO's, a low detection level for the shortcircuit current cannot be established due to operational margin required. That is, the detection level has to be set to a high level when the operational margin is taken into consideration. By this is meant that the detection of the shortcircuit becomes difficult accordingly. Thus, unless the resistance of the GTO to dv/dt materially increases to increase the characteristic impedance of the snubber charging circuit to decrease the charging current, the D.C. current detection method is not appropriate to detect the shortcircuit in the GTO inverter. Particularly when a shunt resistor is used for the detection, the shunt resistance increases as the inverter capacity increases and hence this method is not apropriate in view of the circuit loss and the resistance to noise.

When the shortcircuit is to be detected by the GTO voltage which is an indirect sample, it is necessary to discriminate a pseudo shortcircuit which exists in normal operation from a true shortcircuit. The time required for the discrimination is approximately 20μ seconds, which is fairly long. Accordingly, this method has a disadvantage in that it cannot attain high speed detection which is the most important requirement for detecting the shortcircuit. In addition, this method uses dividing resistors to detect the voltage drop of the GTO. Since a voltage is necessarily applied to the GTO for one-half period, the capacity of the dividing resistors must comply with that voltage.

SUMMARY OF THE INVENTION

It is an object of the present invention to provide a device for rapidly and positively detecting the shortcircuit in the arm of the GTO inverter.

The gist of the present invention lies in the use of a voltage across a current limiting reactor as a measure for detecting the shortcircuit in the arm.

Unlike transistors, the GTO does not have a current limiting function by itself. Accordingly, the current limiting reactor is necessary to suppress a current rising factor in case of shortcircuit. This current limiting reactor is used to detect the shortcircuit in the arm of the GTO inverter. It may be used in one of the following two ways. In one way, the shortcircuit is detected when voltages are applied simultaneously to a P-line reactor and an N-line reactor of the GTO inverter for a predetermined time period, and in the other way the shortcircuit is detected when an integrated value of the voltage applied to at least one of the P-line reactor and the N-line reactor of the GTO inverter exceeds a predetermined voltage. The latter method can detect the shortcircuit in a shorter time than the former method.

DESCRIPTION OF THE PREFERRED EMBODIMENTS

Figure 1:
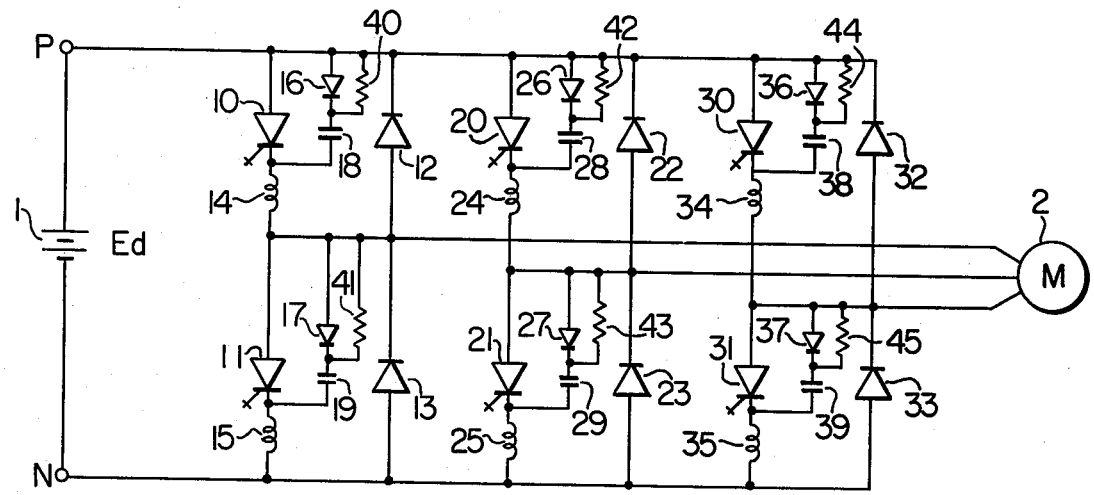
FIG. 1 shows an example of a main circuit configuration of a GTO inverter.

Generally, a 3-phase 6-arm GTO inverter is constructed as shown in FIG. 1, in which numeral 1 denotes a D.C. power supply, P denotes a positive terminal of the power supply 1, N denotes a negative terminal of the power supply 1, numeral 2 denotes a load A.C. motor, numerals 10, 11, 20, 21, 30 and 31 denote GTO's numerals 12, 13, 22, 23, 32 and 33 denote feedback diodes, numerals 14, 15, 24, 25, 34 and 35 denote current limiting reactors, numerals 16, 17, 26, 27, 36 and 37 denote snubber diodes, numerals 18, 19, 28, 29, 38 and 39 denote snubber capacitors and numerals 40, 41, 42, 43, 44 and 45 denote snubber resistors.

Figure 2:
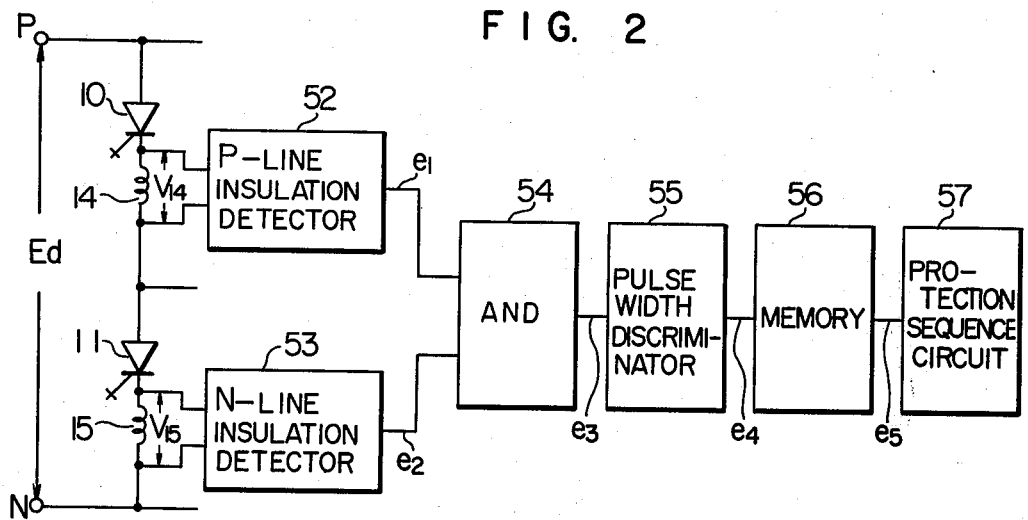
FIG. 2 shows an embodiment in which the present invention is applied to one phase portion of the circuit shown in FIG. 1.

FIG. 2 shows an embodiment of the present invention which embodies the present invention for one-phase two-arm portion of the circuit shown in FIG. 1. in FIG. 2, numerals 52 and 53 denote P-line and N-line insulation detectors, respectively, numeral 54 denotes an AND circuit, numeral 55 denotes a pulse width discriminator. numeral 56 denotes a memory circuit and numeral 57 denotes a protection sequence circuit.

Figure 3:
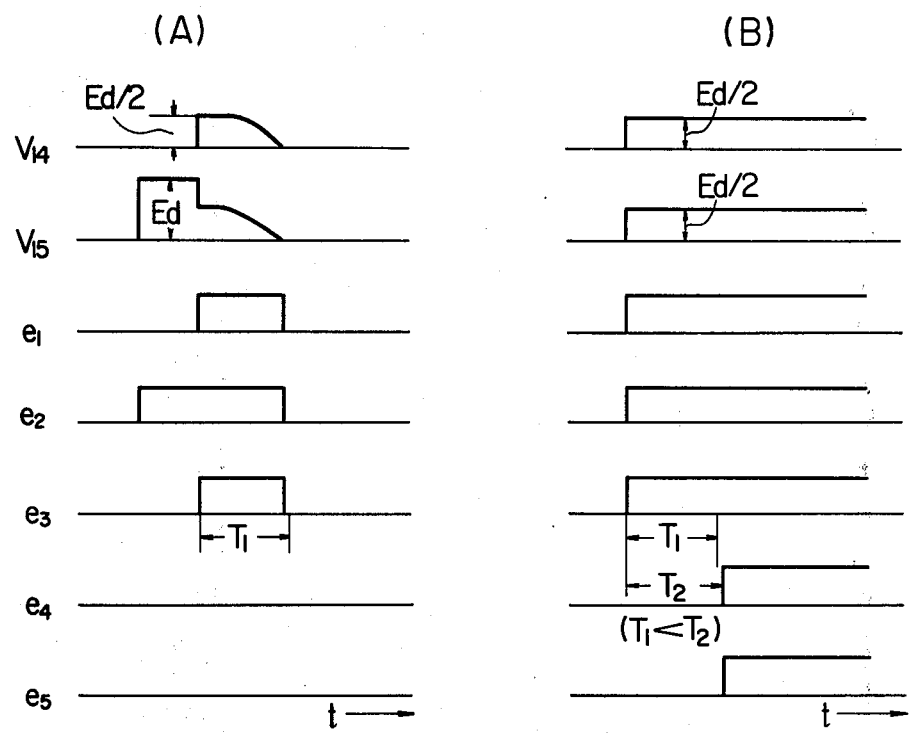
FIGS. 3(A) and 3(B) show operational waveforms in the detection circuit shown in FIG. 2.

FIG. 3 shows operational waveforms in the detection circuit shown in FIG. 2, in which FIG. 3(A) shows waveforms for a pseudo shortcircuit and FIG. 3(B) shows waveforms for true shortcircuit. The pseudo shortcircuit and the true shortcircuit are discriminated in the following manner. Referring to FIGS. 2 and 3, when an output signal $e_3$ of the AND circuit 54 lasts longer than a time period $T_1$ indicative of the pseudo shortcircuit (FIG. 3(B)), it is determined that the true shortcircuit has occurred. This is determined by the pulse width discriminator 55 having a preset pulse width $T_2$ longer than $T_1$. The time period $T_1$ may be a time required for the snubber capacitor to be charged to Ed/2 where Ed is an anode voltage of the GTO. The time period $T_1$ can be expressed by the following formula;

$$T_1 = \frac{\pi}{3} \sqrt{2LC}$$

where C is a capacitance of the snubber capacitor and L is an inductance of the current limiting reactor. For given magnitudes of C and L, $T_1$ is constant and does not vary depending on the operation condition of the inverter.

Figure 4:
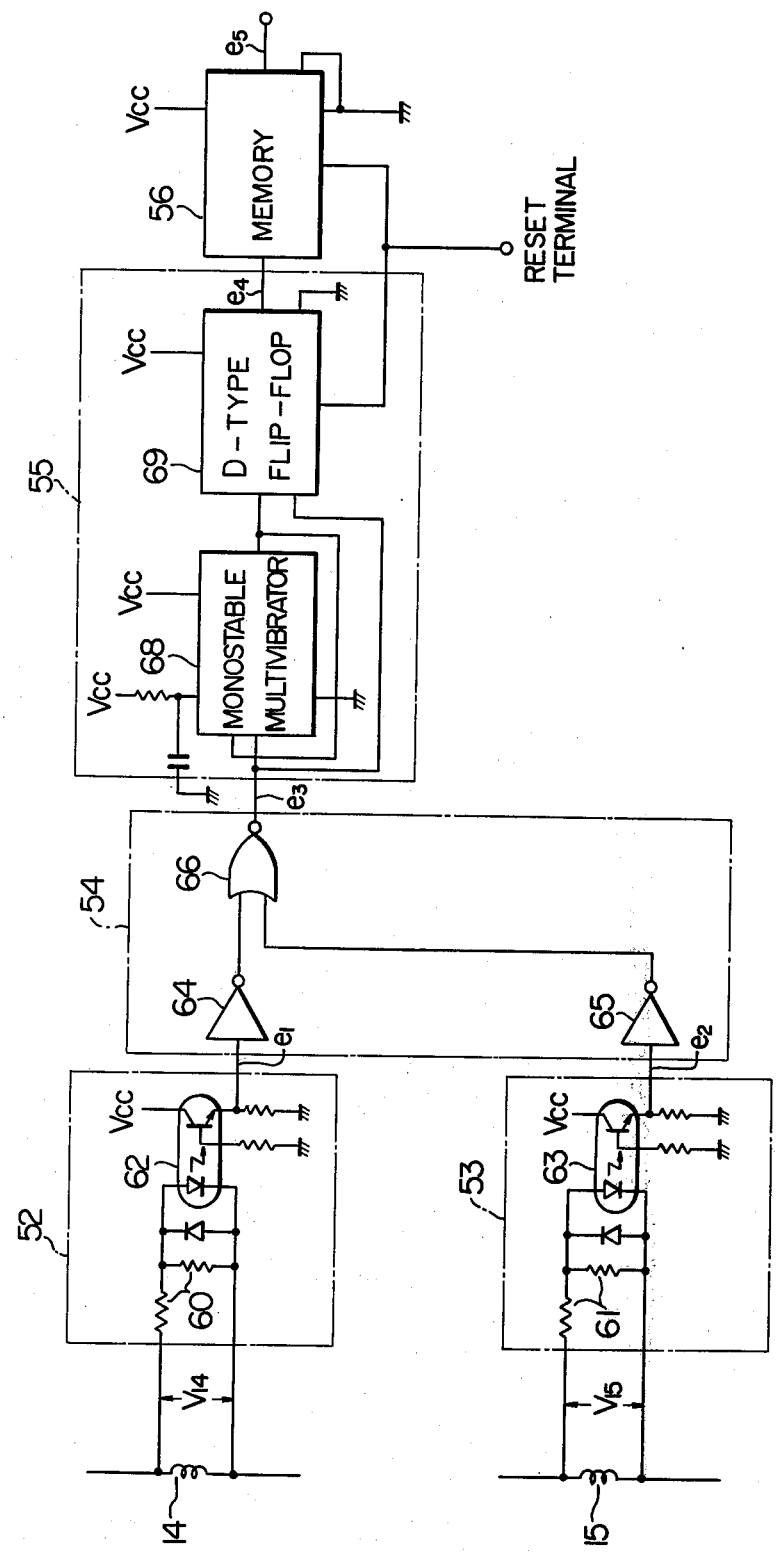
FIG. 4 shows a specific circuit configuration of the detection circuit shown in FIG. 2.

FIG. 4 shows a specific circuit configuration of the circuit blocks shown in FIG. 2. The insulation detectors 52 and 53 respectively comprise dividing resistors 60 and 61 and photo-couplers 62 and 63. The AND circuit 54 comprises NOT circuits 64 and 65 and a NOR circuit 66. The pulse width discriminator 55 comprises a monostable multivibrator 68 and a D-type flip-flop 69, an output of which is provided depending on whether an output of the AND circuit 54 remains or not when an output of the monostable multivibrator 68 is reset. The succeeding stage, the memory circuit 56 which comprises a J-K flip-flop is provided to store the shortcircuit signal produced, for display.

In FIGS. 2, 3 and 4, $V_{14}$ denotes a voltage across the P-line current limiting reactor 14, $V_{15}$ denotes a voltage across the N-line current limiting reactor 15, $e_1$ denotes an output signal of the P-line detector 52, $e_2$ denotes an output signal of the N-line detector 53, $e_3$ denotes an output signal of the AND circuit 54, $e_4$ denotes an output signal of the pulse width discriminator 55 and $e_5$ denotes an output signal of the memory circuit 56.

When the shortcircuit in the arm is to be detected by the voltage across the current limiting reactor, it is detected by the condition that the voltages are coincidentally applied to the P-line and N-line reactors. To compare the present circuit with the GTO voltage detection method which is one of the prior art detection methods, the discrimination voltage is equal to Ed/4. Since no current flows through the feedback diode of the arm, the time required to discriminate the pseudo shortcircuit from the true shortcircuit is shortened accordingly.

Thus, in accordance with the present embodiment, the shortcircuit in the arm can be detected with a delay time (approximately $10\mu$ seconds) which is less than one half of that required in the GTO voltage detection method.

Furthermore, in accordance with the present embodiment, the capacity of the dividing resistors can be considerably reduced in comparison with the GTO voltage detection method because the voltage is applied to the current limiting reactor only momentarily during the normal switching operation.

As described hereinabove, according to the present invention, the shortcircuit in the arm of the GTO inverter can be rapidly and positively detected.

Figure 5:
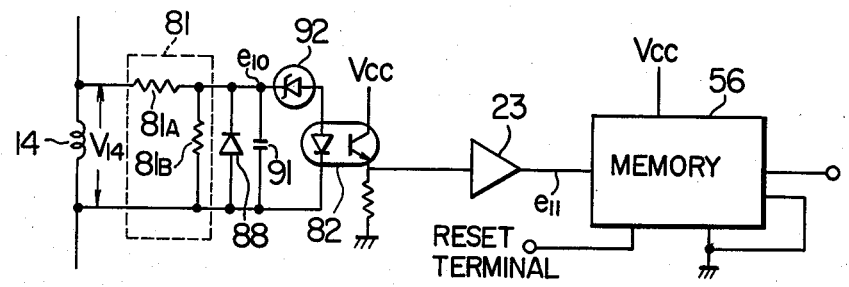
FIG. 5 shows a circuit configuration of another embodiment of the present invention.

FIG. 5 shows another embodiment of the present embodiment. In the present embodiment, an integrated value of the voltage across at least one current limiting reactor is used to discriminate the pseudo shortcircuit from the true shortcircuit. This is different from the previous embodiment which uses the duration of the voltages across both of the current limiting reactors. The present embodiment notes the difference between the voltage waveform for the pseudo shortcircuit and the voltage waveform for the true shortcircuit. In the present embodiment, a method and apparatus for detecting the shortcircuit in the arm by sensing the voltage across the current limiting reactor 14 are explained. It should be understood that the current limiting reactor 15 instead of the reactor 14 may be used or both current limiting reactors 14 and 15 may be used to sense the voltage.

In FIG. 5, a zener diode 92 is connected to one end of the current limiting reactor 15 through a resistor 81A of the dividing resistors 81. A photocoupler 82 is connected to the zener diode 92. Connected to the resistor 81A are a resistor 81B, a cathode of a diode 88 and one terminal of an integration capacitor 91. The other terminal of the current limiting reactor 14 is connected to the resistor 81B, an anode of the diode 88, the other terminal of the integration capacitor 91 and the photo-coupler 82.

On the other hand, an output of the photo-coupler 82 is applied to the memory circuit 56 through a buffer 83.

Figure 6:
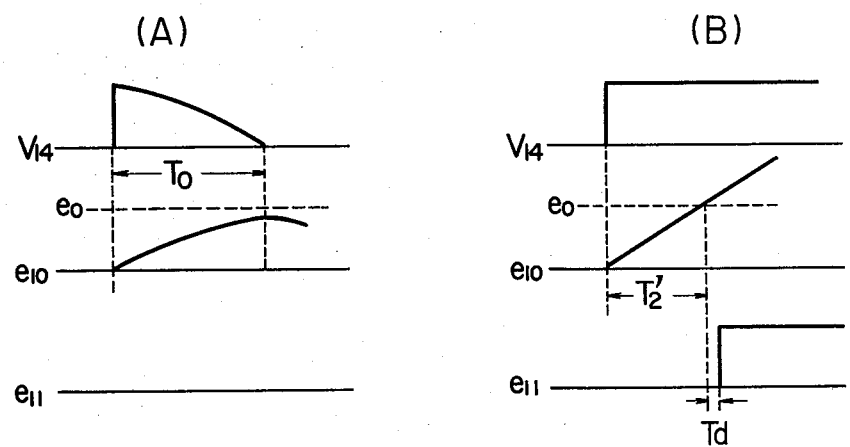
FIGS. 6(A) and 6(B) show operational waveforms of the detection circuit shown in FIG. 5.

In the construction described above, when a signal $V_{14}$ shown in FIG. 6(A) is detected by the current limiting reactor 14 at the time of switching under no load and applied to the integration capacitor 91, the voltage across the integration capacitor 91 rises sinusoidally as shown in FIG. 6(A), $e_{10}$ and it reaches a peak around the zero level of $V_{14}$ shown in FIG. 6(A). Accordingly, by choosing the zener voltage of the zener diode 92 to be larger than the peak voltage, e.g. at $e_0$ of $e_{10}$ shown in FIG. 6(A), the photo-coupler is not activated and the signal $V_{14}$ is eliminated. When a signal $V_{14}$ shown in FIG. 6(B) which indicates the true shortcircuit, the voltage across the integration capacitor rises exponentially as shown by $e_{10}$ in FIG. 6(B). By choosing the target voltage to be equal to $e_0$ which is much larger than the zener voltage, the change of the voltage to the target voltage will be linear. The gradient of this linear line is equal to the rising rate of the signal $e_0$ when the signal $V_{14}$ at the switching under no load condition shown in FIG. 6(A) is applied. Accordingly, the time period $T'_2$ required for the voltage across the integration capacitor 91 to reach the zener voltage level $e_{10}$ shown in FIG. 6(B) is shorter than the time period $T_0$ for the input signal $V_{14}$ at the time of no-load switching shown in FIG. 6(A), i.e., $T'_2$ is approximately equal to $\frac{2}{3} \cdot T_0$. Since the operational delay of the succeeding stage photo-coupler is only Td at switching, the operational delay of the detection circuit is equal to $Td + T'_2$ (approximately $5-7\mu$ seconds). Thus, the high speed detection of twice as fast as the prior art circuit is attained. The target value $e_{10}$ of the integration capacitor and the ratio thereof to the zener voltage can be selected to any desired values by suitably choosing the integration time constant and the dividing ratio, respectively.

Accordingly, in accordance with the present embodiment, the shortcircuit in the GTO inverter can be detected in a time period which is approximately 50-60% of the time required in the previous embodiment, and the main circuit configuration can be simplified by handling the shortcircuit current by effectively utilizing self-quenching ability of the device.

Furthermore, in accordance with the present embodiment, the circuit configuration of the detection circuit per se is simplified and, because of the integration type circuit is insensitive to the noise and can control the current within a controllable current range.

As described hereinabove, the present invention can rapidly detect the shortcircuit in the inverter.

We claim:

1. A method for detecting a shortcircuit in an arm of a GTO inverter provided with at least one pair of arms, each arm being composed of a series connection of a single gate turn-off thyristor and a single reactor, said method comprising the steps of:

sensing the voltage across each of said reactors of said paired arms;

detecting if said sensed voltages across said reactors last coincidentally for longer than a predetermined time period; and determining the shortcircuit in one of said paired arms when said voltages last coincidentally for longer than said predetermined time period.

2. A method for detecting a shortcircuit in an arm of a GTO inverter according to claim 1, wherein said predetermined time period is selected to be equal to a time period required for a snubber capacitor of the inverter to be charged to one half of the GTO anode voltage.

3. An apparatus for detecting a shortcircuit in an arm of a GTO inverter provided with at least one pair of arms, each arm being composed of a series connection of a single gate turn-off thyristor and a single reactor, said apparatus comprising:

(i) first means connected across one of the reactors of said paired arms for sensing a voltage thereacross;

(ii) second means connected across the other of said reactors for sensing a voltage thereacross;

(iii) third means connected to said first and second means for ANDing the outputs thereof; and (iv) fourth means connected to the output of said third means for detecting if said third means produces an output for longer than a predetermined time period.

4. An apparatus for detecting a shortcircuit in an arm of a GTO inverter according to claim 3, wherein said predetermined time period for said fourth means is selected to be equal to a time period for a snubber capacitor of the inverter to be charged to one half of the GTO anode voltage.

5. An apparatus for detecting a shortcircuit in an arm of a GTO inverter according to claim 3, wherein said fourth means comprises a pulse width discriminator for determining if the pulse width of the output pulse from said third means has a predetermined pulse width.

6. An apparatus for detecting a shortcircuit in an arm of a GTO inverter according to claim 5 wherein said pulse width is selected to be equal to the time required for a snubber capacitor of the GTO to be charged to one half of the GTO anode voltage.

* * * * *